US009310519B2

(12) United States Patent
Myong

(10) Patent No.: US 9,310,519 B2
(45) Date of Patent: Apr. 12, 2016

(54) SEE-THROUGH TYPE PHOTOVOLTAIC MODULE INCLUDING 3-DIMENSIONAL PHOTONIC CRYSTAL, MANUFACTURING METHOD THEREOF, AND INSULATED GLASS UNIT INCLUDING THE SAME

(75) Inventor: Seung-Yeop Myong, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 1178 days.

(21) Appl. No.: 13/287,291

(22) Filed: Nov. 2, 2011

(65) Prior Publication Data
US 2012/0125429 A1 May 24, 2012

(30) Foreign Application Priority Data
Nov. 22, 2010 (KR) .......................... 10-2010-0116123

(51) Int. Cl.
*H01L 31/056* (2014.01)
*H01L 31/048* (2014.01)
*G02B 1/00* (2006.01)
*H01L 31/0236* (2006.01)
*B32B 17/10* (2006.01)

(52) U.S. Cl.
CPC .......... *G02B 1/005* (2013.01); *B32B 17/10055* (2013.01); *B32B 17/10761* (2013.01); *B32B 17/10788* (2013.01); *H01L 31/02366* (2013.01); *H01L 31/0488* (2013.01); *H01L 31/056* (2014.12); *Y02E 10/52* (2013.01)

(58) Field of Classification Search
CPC ..................... H01L 31/02366; H01L 31/0488; H01L 31/056
See application file for complete search history.

(56) References Cited

U.S. PATENT DOCUMENTS

| 5,128,181 A * | 7/1992 | Kunert ............................ 428/34 |
| 5,421,909 A * | 6/1995 | Ishikawa et al. .............. 136/256 |
| 2006/0126695 A1* | 6/2006 | Koyama ................ H01S 5/0264 372/50.124 |
| 2010/0326513 A1* | 12/2010 | Lee ...................... H01G 9/2031 136/256 |

FOREIGN PATENT DOCUMENTS

| CN | 101399294 | 4/2009 |
| CN | 101752093 | 6/2010 |
| CN | 101807613 | 8/2010 |
| KR | 100830946 | 5/2008 |
| KR | 1020090032988 | 4/2009 |

OTHER PUBLICATIONS

Bermel et al. Improving thin-film crystallin silicon solar cell efficiencies with photonic crystals. Optics Express, 2007, vol. 15, pp. 16986-17000.*
Bielawny et al. Diffractive and energy selective photonic crystals for thin-film tandem solar cells. Proc. of SPIE 2007, volumne 6651, document 665106.*
Vlasov et al. On-chip natural assembly of silicon photonic bandgap crystals. Nature 2001, volumne 414, pp. 289-293.*
Lower, Stephen. UC Davis Chem Wiki Section 7.8 Cubic Lattices and Close Packing.*

* cited by examiner

*Primary Examiner* — Susan D Leong
(74) *Attorney, Agent, or Firm* — H.C. Park & Associates, PLC

(57) ABSTRACT

Disclosed is a see-through type photovoltaic module that includes: a first transparent substrate; a second transparent substrate; a first transparent electrode and a second electrode, all of which are placed between the first transparent substrate and the second transparent substrate; a photoactive layer being placed between the first transparent electrode and the second electrode and converting light into electrical energy; and a protective layer placed between the second electrode and the second transparent substrate, wherein a 3-dimensional photonic crystal structural layer is formed on the surface of the second transparent substrate facing the first transparent substrate.

12 Claims, 3 Drawing Sheets

SEE-THROUGH TYPE PHOTOVOLTAIC MODULE INCLUDING 3-DIMENSIONAL PHOTONIC CRYSTAL, MANUFACTURING METHOD THEREOF, AND INSULATED GLASS UNIT INCLUDING THE SAME

CROSS-REFERENCE TO RELATED APPLICATIONS

This application claims priority under 35 U.S.C. §119 to Korean Patent Application No. 10-2010-0116123 filed on Nov. 22, 2010, the entirety of which is hereby incorporated by reference.

FIELD OF THE INVENTION

The present invention relates to a see-through type photovoltaic module capable of improving not only an aesthetic feature but also a photovoltaic efficiency, a manufacturing method thereof and insulated glass unit including the same.

BACKGROUND OF THE INVENTION

Recently, as existing energy resources like oil and coal and the like are expected to be exhausted, much attention is increasingly paid to alternative energy sources which can be used in place of the existing energy sources. As an alternative energy sources, sunlight energy is abundant and has no environmental pollution. Therefore, more and more attention is paid to the sunlight energy.

A photovoltaic module converting sunlight energy into electrical energy has a junction structure of a p-type semiconductor and an n-type semiconductor. When light is incident on the photovoltaic module, an electron with a negative electric charge and a hole with a positive electric charge are generated by interaction between the light and a material constituting the semiconductor of the photovoltaic module. Then, electric current flows while the electron and the hole move.

More attention is now being increasingly paid to a building integrated photovoltaic (BIPV) module which is installed on the ceiling, wall or window of a building and generates electricity. The BIPV module is required to retain not only an original function of electric power generation but also various features. Particularly, since the BIPV module constitutes the building envelope, it is necessary to provide a photovoltaic module having an improved aesthetic feature.

SUMMARY OF THE INVENTION

An aspect of the present invention is a see-through type photovoltaic module. The see-through type photovoltaic module includes: a first transparent substrate; a second transparent substrate; a first transparent electrode and a second electrode, all of which are placed between the first transparent substrate and the second transparent substrate; a photoactive layer being placed between the first transparent electrode and the second electrode and converting light into electrical energy; and a protective layer placed between the second electrode and the second transparent substrate, wherein a 3-dimensional photonic crystal structural layer is formed on the surface of the second transparent substrate facing the first transparent substrate.

Another aspect of the present invention is a manufacturing method of a see-through type photovoltaic module. The manufacturing method includes: providing a first transparent substrate; forming an opal template including colloidal particles on the first transparent substrate; infiltrating a material into the void spaces between the colloidal particles of the opal template with a material; and removing the opal template such that an inverse opal structure is formed on the first transparent substrate.

Further another aspect of the present invention is a triple insulated glass unit. The triple insulated glass unit includes: a first transparent substrate; a second transparent substrate; a first transparent electrode and a second electrode, all of which are placed between the first transparent substrate and the second transparent substrate; a photoactive layer being placed between the first transparent electrode and the second electrode and converting light into electrical energy; a protective layer placed between the second electrode and the second transparent substrate; a third transparent substrate; and a thermal insulating layer separating the second transparent substrate from the third transparent substrate, wherein a 3-dimensional photonic crystal structural layer is formed on at least one of the front surface of the second transparent substrate facing the first transparent substrate, the rear surface of the second transparent substrate and the front surface of the third transparent substrate facing the first transparent substrate.

DETAILED DESCRIPTION

Figure 1:
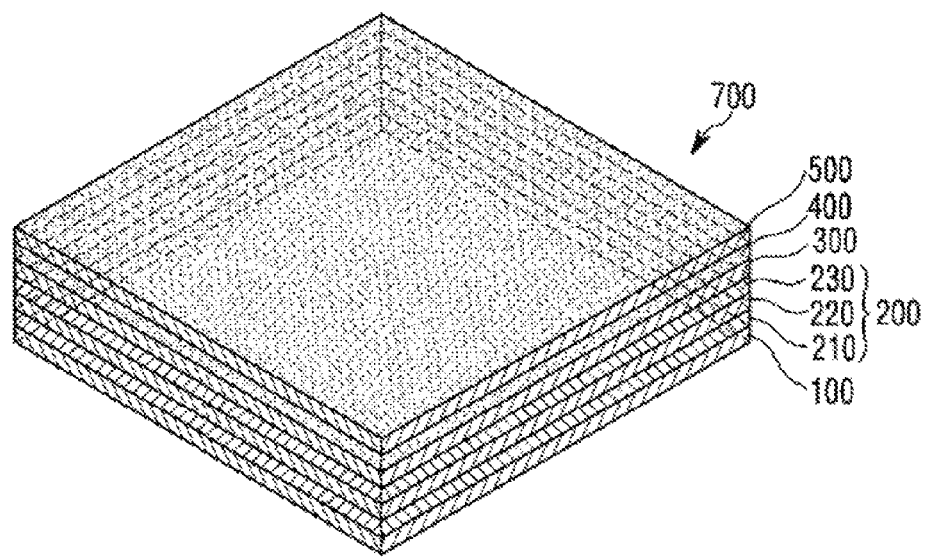
FIG. 1 shows a see-through type photovoltaic module including 3-dimensional photonic crystals according to an embodiment of the present invention.

Hereafter, an exemplary embodiment of the present invention will be described in detail with reference to the accompanying drawings. Here, the embodiment of the present invention can be variously transformed, and the scope of the present invention is not limited to the following embodiment. The shapes and sizes of the components in the drawings may be exaggerated for clarity of the description. It is noted that the same reference numerals are used to denote the same elements throughout the drawings. In the following description of the present invention, the detailed description of known functions and configurations incorporated herein is omitted when it may make the subject matter of the present invention unclear.

FIG. 1 shows a see-through type photovoltaic module including 3-dimensional photonic crystals according to an embodiment of the present invention. A see-through type photovoltaic module 700 according to the embodiment of the present invention includes a first substrate 100, a photovoltaic layer 200, a protective layer 300, and a second substrate 500 having 3-dimensional photonic crystals 400 formed thereon.

The first substrate 100 may be a transparent insulating substrate like glass.

The photovoltaic layer 200 formed on the first substrate 100 includes a first electrode 210, a photoactive layer 220 and a second electrode 230. The first electrode 210 may include a transparent conductive oxide (TCO) such as $SnO_2$, ZnO or ITO.

The photoactive layer 220 converts incident light into electrical energy. The photoactive layer 220 may include one of an amorphous photoelectric conversion layer, a single crystalline photoelectric conversion layer, a poly crystalline photoelectric conversion layer, an organic photoelectric conversion layer, an organic and inorganic photoelectric conversion layer or a compound photoelectric conversion layer. The single crystalline photoelectric conversion layer includes impurity doped single crystalline silicon. The poly crystalline photoelectric conversion layer includes impurity doped poly crystalline silicon. The compound photoelectric conversion layer may include group I-III-VI compound semiconductor, group II-VI compound semiconductor or group III-V compound semiconductor. The photoactive layer 220 may include a tandem type photoelectric conversion layer including a plurality of unit cells stacked therein or a heterojunction with intrinsic thin-layer (HIT) type photoelectric conversion layer formed through heterojunction of amorphous silicon and crystalline silicon.

The second electrode 230 may be a transparent electrode like the first electrode. The second electrode 230 is, only required to allow light to pass therethrough and is not necessarily formed of a transparent material.

The protective layer 300 formed on the second electrode 230 not only protects the photovoltaic layer 200 but also functions to bond the photovoltaic layer 200 to the second substrate on which the 3-dimensional photonic crystals to be described below are formed. The protective layer 300 may include a thermoplastic film or a thermosetting film, for example, ethylene vinyl acetate (EVA) or poly vinyl butyral (PVB).

The second substrate 500 having the 3-dimensional photonic crystal 400 formed thereon is placed on the protective layer 300. The second substrate 500 having the 3-dimensional photonic crystal 400 formed thereon may be a transparent insulating substrate like glass.

Based on the embodiment of the present invention, the 3-dimensional photonic crystal 400 may include an inverse opal structure. The inverse opal structure is formed by an opal replica of which interior is empty. Therefore, when the second substrate 500 having the inverse opal structure formed thereon is used as a rear substrate of the photovoltaic module, the durability thereof may be expected to be relatively reduced. However, when the second substrate 500 having the inverse opal structure formed thereon is laminated in the photovoltaic module, the inverse opal structure 400 comes in contact with the protective layer 300. Accordingly, a material forming the protective layer 300 functions as filler to be filled in the empty space of the inverse opal structure 400, so that the durability and weatherability can be improved.

Hereafter, a process of forming the inverse opal structure on the transparent substrate 500 will be described with reference to FIGS. 2a to 2d.

Figure 2A:
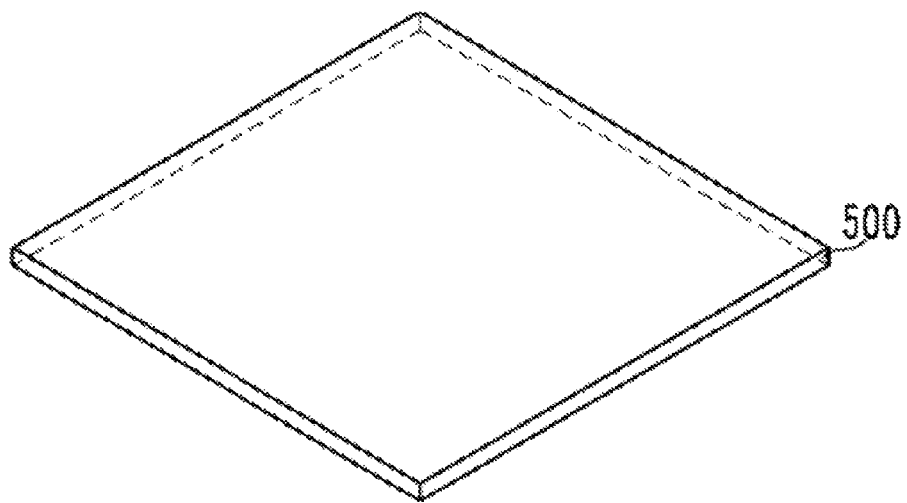
FIGS. 2a to 2d show a manufacturing process of forming an inverse opal structure on a see-through type substrate according to the embodiment of the present invention.

As shown in FIG. 2a, provided is the transparent substrate 500 like glass, on which the 3-dimensional photonic crystals are formed. The surface of the substrate 500, on which the 3-dimensional photonic crystals are formed, is cleaned, and pollutants and organic materials of the surface are hereby removed. The method of cleaning the surface of the substrate 500 includes wet cleaning, or dry cleaning using atmospheric pressure plasma. As a result, the surface of the substrate 500, on which the 3-dimensional photonic crystals are formed, becomes hydrophilic.

Figure 2B:
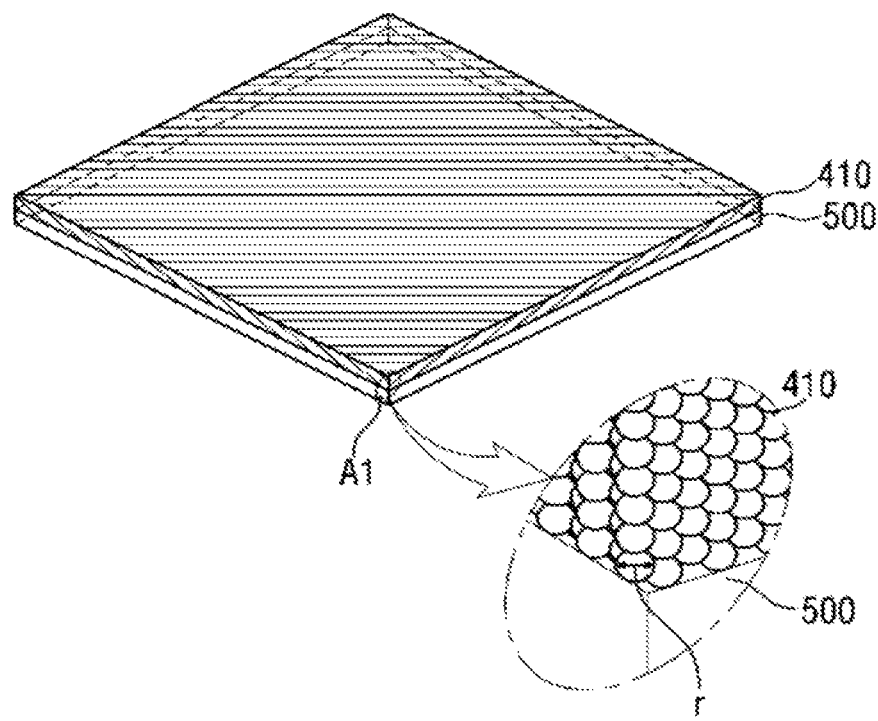

As shown in FIG. 2b, an opal template 410 for forming the inverse opal structure is formed on the substrate 500. Artificial opal can be generally used as a material of the opal template, for example, a monodisperse polymer colloid like polymethyl methacrylate (PMMA), $SiO_2$ colloid, $TiO_2$ colloid or $Al_2O_3$ colloid.

The opal template is densely packed through crystallization by a heat treatment and the like and can be easily removed after an opal replica is formed later. The shape of the opal template is shown in detail in an enlarged view of A1 of FIG. 2b.

In the embodiment using the substrate having the inverse opal structure formed thereon, the size of the colloidal particle of the opal template may be controlled so as to reflect light with a desired wavelength. The size of the colloidal particle can be easily controlled by monomer concentration in the water or temperature.

The diameter "r" of the colloidal particle may be equal to or larger than 200 nm and equal to or less than 500 nm. The inverse opal structure which is hereby formed when the diameter "r" of the colloidal particle is within the above-mentioned range can reflect light with a wavelength from 400 nm to 1100 nm. Accordingly, the inverse opal structure 400 formed from the colloidal particle having the aforementioned diameter reflects effectively light with a wavelength including a visible light region, so that an aesthetic feature can be improved. Additionally, when the substrate on which the inverse opal structure 400 has been formed according to the embodiment of the present invention is used as a rear substrate of the see-through type photovoltaic module, photovoltaic conversion efficiency can be enhanced by back reflection.

The colloid can be coated on the substrate 500 by using a coating method such as a spray method, a screen printing method, a sol-gel method, an inkjet printing method and a laser printing method and the like.

What's more, the colloid can be coated on the substrate 500 by gravure printing. Here, the colloid may be coated on the substrate 500 in such a manner as to include a particular pattern.

Further, after the colloid is coated on the substrate 500, the opal template formed by the coating is heat-treated at a temperature of from 60° C. to 120° C. Through the heat treatment, it is possible to strengthen the inter-bonding between the spherical colloidal particles within the opal template, and consequently, the opal template can be stabilized. Also, the heat treatment can partly contribute to the crystallization of the opal template. When the temperature of the heat treatment is lower than 60° C., a time required for performing the heat treatment for stabilizing the opal template is increased, so that the process may be delayed. When the temperature of the heat treatment is higher than 120° C., the opal template may be transformed due to the high temperature.

Figure 2C:
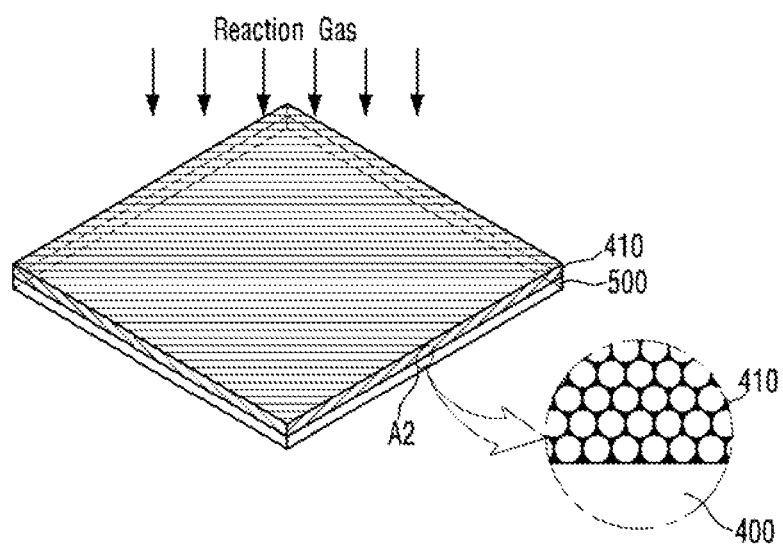

As shown in FIG. 2C, reaction gas is introduced and filled in the void spaces between the colloidal particles within the opal template 410. A material filling the void spaces may have a permittivity quite different from that of the opal template 410. Therefore, the material filling the void spaces may include a metal, a metal oxide or carbon. In particular, the material may include a transparent oxide such as ZnO, IZO, ITO or graphene and the like. A state in which the material has been filled in the void spaces is shown in an enlarged view of A2 of FIG. 2c.

The reaction gas including the material filling the void spaces is infiltrated into the inside of the opal template at a low temperature of from 25° C. to 100° C. by using a chemical vapor deposition (CVD) method or an atomic layer deposition (ALD) method. The void spaces can be filled by the chemical reactions of precursors. When the reaction gas is introduced at a temperature lower than 25° C., the chemical reaction may not be activated. Also, even when the deposition is performed, there is a possibility that an inverse opal structure which may be easily exfoliated due to excessive stress is formed. When the reaction gas is introduced at a temperature higher than 100° C., a reaction material may be transformed.

The permittivity of the material filling the void spaces may be equal to or greater than 2.0 and equal to or less than 6.25. When the permittivity of the reverse material is less than 2.0, the inverse opal structure constituted by the material rarely performs a function of a photonic crystal, in consideration of the permittivity of air which further fills the empty space of the inverse opal structure. When the permittivity of the material is greater than 6.25, the inverse opal structure substantially loses photonic crystal properties.

The volume filling ratio of the material filling the void spaces may be equal to or greater than 10% and equal to or less than 26%. When the volume filling ratio is less than 10%, the photonic crystal properties or mechanical strength of the inverse opal structure 400 to be further manufactured is reduced. The volume filling ratio cannot exceed 26% theoretically.

Figure 2D:
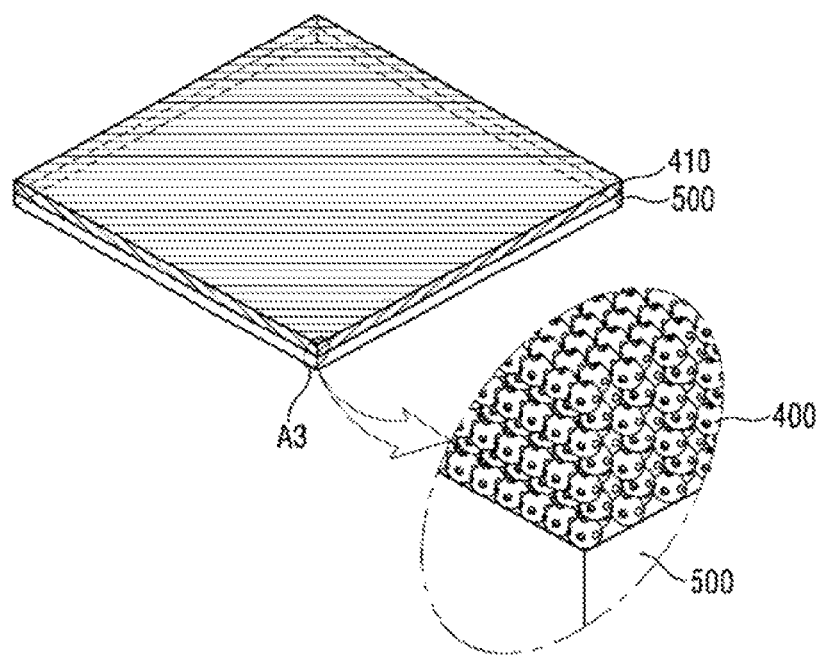

As shown in FIG. 2d, the inverse opal structure 400 constituted by the opal replicas is formed by removing the opal through a wet chemical etching. The inside of the opal replica is filled with air, so that an effective refractive index is about 1 and 3-dimensional photonic crystal having a very low refractive index is formed.

After the opal is removed as described above, a rinse process is performed to remove residues. Then, the moisture of the inverse opal structure 400 is removed by a dry process or by performing a heat treatment process at a temperature from 40° C. to 90° C. at an oven. When the heat treatment process is performed at a temperature lower than 40° C., the moisture cannot be efficiently removed and the heat treatment process time may be increased. When the heat treatment process is performed on the inverse opal structure at a temperature higher than 90° C., the inverse opal structure may be transformed.

The inverse opal structure 400 may preferably include at least one and equal to or less than 50 inverse opal layers. This can be obtained by stacking the spherical colloidal particles described in FIG. 2b in the form of at least one layer and equal to or less than 50 layers. At least one inverse opal layer is required to enable the inverse opal structure 400 to function as the photonic crystal. Further, when the inverse opal structure 400 includes more than 50 inverse opal layers, the durability may be deteriorated considering that the inside of the opal replicas is empty.

In the see-through type photovoltaic module according to the embodiment of the present invention, the inverse opal structure, that is, one of three dimensional photonic crystal as described above is formed on the front surface of the second substrate 500, that is, the rear substrate of the photovoltaic module 700. Therefore, the photovoltaic module 700 can show various colors due to the interference color of the inverse opal structure 400. The inverse opal structure 400 reflects light passing through the photovoltaic layer 200 and arriving at the inverse opal structure 400 back to the photovoltaic layer 200, so that light utilization efficiency may be improved. Consequently, the photovoltaic conversion efficiency of the photovoltaic module 700 can be enhanced.

As a similar manner that a band gap having no electron is formed by a periodic structure of atomic nuclei, the above result comes from a fact that periodic dielectric structure of several hundred nanometers to several micrometers disallows certain bands of wavelengths to travel through the structure. The disallowed bands of wavelengths are called photonic band gaps.

In other words, photonic crystals contain regularly repeating regions of high and low dielectric constant. When light is incident to the photonic crystals, a particular wavelength is reflected by Bragg's Law. Since the same cycle is repeated, the particular wavelength is reflected each time the light is incident to regions having the same dielectric constant. Therefore, the light with the particular wavelength cannot be present within the photonic crystals and is reflected. As a result, the photonic crystals reflect light with a particular wavelength and absorb light with other wavelengths.

As described above with reference to FIGS. 2a to 2d, the 3-dimensional photonic crystals is separately formed on the rear substrate and is included in the photovoltaic module by being further laminated on the first substrate on which the photovoltaic layer has been formed. Therefore, it is possible to prevent the danger of chemical reaction, which is caused by forming the 3-dimensional photonic crystals within the photovoltaic layer including the first electrode, the photoactive layer and the second electrode. Besides, since the 3-dimensional photonic crystals are separately formed on the rear substrate, the process of forming the 3-dimensional photonic crystals is easy to perform.

Figure 3:
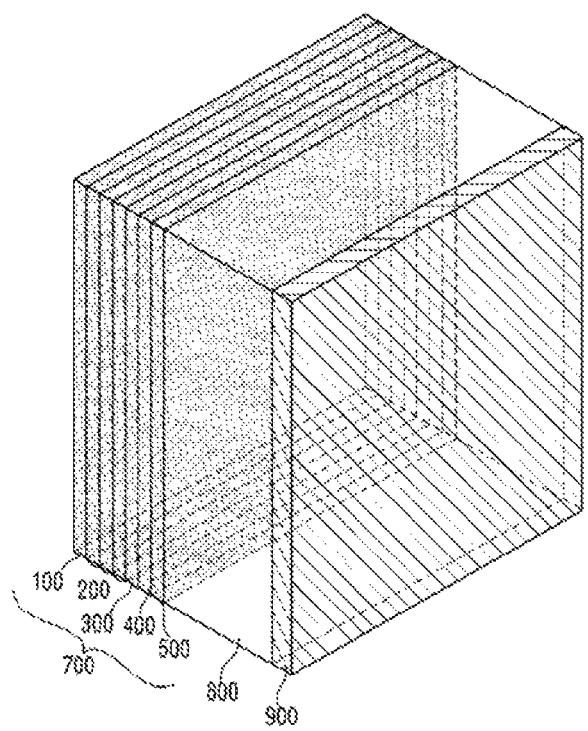
FIG. 3 shows an insulated glass unit including a see-through type photovoltaic module using 3-dimensional photonic crystals according to the embodiment of the present invention.

FIG. 3 shows a triple insulated glass unit including the see-through type photovoltaic module 700 according to the embodiment of the present invention.

The insulated glass unit according to the embodiment of the present invention includes the see-through type photovoltaic module 700 shown in FIG. 1, a third substrate 900 and a thermal insulating layer 800 separating the see-through type photovoltaic module 700 from the third substrate 900.

The thermal insulating layer 800 for blocking the heat transfer is constituted by air. The thermal insulating layer 800 may be also constituted by argon (Ar) gas, krypton (Kr) gas or may be in a vacuum state.

The third substrate 900 may be a transparent insulating substrate like glass.

Though FIG. 3 shows that the inverse opal structure 400 is formed on the front surface of the second substrate 500 (hereafter, referred to as a first position), that is, is formed in a direction toward the first substrate 100, the inverse opal structure 400 can be formed in a position other than the first position. For example, according to the embodiment of the present invention, the inverse opal structure 400 may be formed on the rear surface of the second substrate 500 (hereafter, referred to as a second position), that is, may be formed in a direction toward the third substrate 900. Further, according to the embodiment of the present invention, the inverse opal structure 400 may be formed on the front surface of the third substrate 900 (hereafter, referred to as a third position), that is, may be formed in a direction toward the first substrate 100 among both surfaces of the third substrate 900.

According to the embodiment of the present invention, the inverse opal structure 400 may be formed in at least one position among the first, the second and the third positions. It is recommended that the inverse opal structure 400 according to the embodiment of the present invention is formed in the inside of the insulated glass unit, without contacting with the external environment of the insulated glass unit. This intends to prevent damages such as scratches and the like.

As the second substrate 500 and/or the third substrate 900 constituting the photovoltaic module 700 or the insulated glass unit which has been described according to the embodiment of the present invention, safety glass temper by heat treatment at a temperature of from 600° C. to 800° C. can be used for mechanical stability.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A see-through type photovoltaic module comprising:
   a first transparent substrate;
   a second transparent substrate;
   a first transparent electrode and a second electrode placed between the first transparent substrate and the second transparent substrate;
   a photoactive layer being placed between the first transparent electrode and the second electrode and converting light into electrical energy; and
   a protective layer placed between the second electrode and the second transparent substrate,
   wherein a 3-dimensional photonic crystal structural layer is formed on the surface of the second transparent substrate facing the first transparent substrate,
   wherein the 3-dimensional photonic crystal structural layer comprises an inverse opal structure and an empty space inside of the inverse opal structure,
   wherein the protective layer contacts with the 3-dimensional photonic crystal structural layer, and
   wherein a material of the protective layer is filled within a portion of the empty space.

2. The see-through type photovoltaic module of claim 1, wherein the 3-dimensional photonic crystal structural layer reflects light with a wavelength from 400 nm to 1100 nm.

3. The see-through type photovoltaic module of claim 1, wherein the permittivity of the 3-dimensional photonic crystal structural layer is equal to or greater than 2.0 and equal to or less than 6.25.

4. The see-through type photovoltaic module of claim 1, wherein the volume filling ratio of the 3-dimensional photonic crystal structural layer is equal to or greater than 10% and equal to or less than 26%.

5. The sec-through type photovoltaic module of claim 1, wherein the 3-dimensional photonic crystal structural layer comprises at least one of ZnO, IZO, ITO and graphene.

6. The see-through type photovoltaic module of claim 1, wherein the 3-dimensional photonic crystal structural layer comprises at least one and equal to or less than 50 inverse opal structure layers.

7. A triple insulated glass unit comprising:
   a first transparent substrate;
   a second transparent substrate;
   a first transparent electrode and a second electrode placed between the first transparent substrate and the second transparent substrate;
   a photoactive layer placed between the first transparent electrode and the second electrode and converting light into electrical energy;
   a protective layer placed between the second electrode and the second transparent substrate;
   a third transparent substrate; and
   a thermal insulating layer separating the second transparent substrate from the third transparent substrate,
   wherein a 3-dimensional photonic crystal structural layer is formed on at least one of the front surface of the second transparent substrate facing the first transparent substrate,
   wherein the 3-dimensional photonic crystal structural layer comprises an inverse opal structure and an empty space inside of the inverse opal structure,
   wherein the protective layer contacts with the 3-dimensional photonic crystal structural layer, and
   wherein a material of the protective layer is filled within a portion of the empty space.

8. The triple insulated glass unit of claim 7, wherein the 3-dimensional photonic crystal structural layer reflects light with a wavelength from 400 nm to 1100 nm.

9. The triple insulated glass unit of claim 7, wherein the permittivity of the 3-dimensional photonic crystal structural layer is equal to or greater than 2.0 and equal to or less than 6.25.

10. The triple insulated glass unit of claim 7, wherein the volume filling ratio of the 3-dimensional photonic crystal structural layer is equal to or greater than 10% and equal to or less than 26%.

11. The triple insulated glass unit of claim 7, wherein the 3-dimensional photonic crystal structural layer comprises at least one of ZnO, IZO, ITO and graphene.

12. The triple insulated glass unit of claim 7, wherein the 3-dimensional photonic crystal structural layer comprises at least one and equal to or less than 50 inverse opal structure layers.

* * * * *